(12) United States Patent
Gan et al.

(10) Patent No.: US 8,916,481 B2
(45) Date of Patent: Dec. 23, 2014

(54) EMBEDDED WAFER LEVEL PACKAGE FOR 3D AND PACKAGE-ON-PACKAGE APPLICATIONS, AND METHOD OF MANUFACTURE

(75) Inventors: Kah Wee Gan, Singapore (SG); Yaohuang Huang, Singapore (SG); Yonggang Jin, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 67 days.

(21) Appl. No.: 13/312,562

(22) Filed: Dec. 6, 2011

(65) Prior Publication Data

US 2013/0105991 A1 May 2, 2013

Related U.S. Application Data

(63) Continuation-in-part of application No. 13/287,826, filed on Nov. 2, 2011, now Pat. No. 8,779,601.

(51) Int. Cl.
| | |
|---|---|
| *H01L 21/31* | (2006.01) |
| *H01L 23/538* | (2006.01) |
| *H01L 23/00* | (2006.01) |
| *H01L 23/498* | (2006.01) |
| *H01L 25/00* | (2006.01) |
| *H01L 21/48* | (2006.01) |
| *H01L 25/10* | (2006.01) |
| *H05K 1/18* | (2006.01) |

(52) U.S. Cl.
CPC ....... *H01L 24/97* (2013.01); *H01L 2924/15321* (2013.01); *H01L 23/5389* (2013.01); *H01L 23/49816* (2013.01); *H01L 2224/16225* (2013.01); *H01L 24/20* (2013.01); *H01L 2224/12105* (2013.01); *H01L 24/19* (2013.01); *H05K 1/186* (2013.01); *H01L 2224/16227* (2013.01); *H01L 2225/1058* (2013.01); *H01L 2224/05569* (2013.01); *H01L 25/50* (2013.01); *H01L 2225/1041* (2013.01); *H01L 2924/01029* (2013.01); *H01L 2924/10253* (2013.01); *H01L 2225/1035* (2013.01); *H01L 2924/15311* (2013.01); *H01L 23/49827* (2013.01); *H01L 21/486* (2013.01); *H01L 2224/97* (2013.01); *H01L 2224/04105* (2013.01); *H01L 2224/0401* (2013.01); *H01L 2224/131* (2013.01); *H01L 24/96* (2013.01); *H01L 2224/05572* (2013.01); *H01L 25/105* (2013.01)
USPC .......................................... 438/760; 438/127

(58) Field of Classification Search
USPC .......... 438/107, 108, 109, 110, 759, 760, 127
See application file for complete search history.

(56) References Cited

U.S. PATENT DOCUMENTS

| | | | | |
|---|---|---|---|---|
| 4,074,342 A | * | 2/1978 | Honn et al. | ........... 361/779 |
| 4,603,374 A | | 7/1986 | Wasielewski | |

(Continued)

OTHER PUBLICATIONS

Chua et al., "Method for Producing Vias in Fan-Out Wafers Using Dry Film and Conductive Paste, and a Corresponding Semiconductor Package," U.S. Appl. No. 12/977,697, filed Dec. 23, 2010, 34 pages.

(Continued)

*Primary Examiner* — S. V. Clark
(74) *Attorney, Agent, or Firm* — Seed IP Law Group PLLC

(57) ABSTRACT

A process for manufacturing a 3D or PoP semiconductor package includes forming a redistribution layer on a reconstituted wafer, then laser drilling a plurality of apertures in the reconstituted wafer, extending from an outer surface of the reconstituted wafer to intersect electrical traces in the first redistribution layer. A solder ball is then positioned adjacent to an opening of each of the apertures. The solder balls are melted and allowed to fill the apertures, making contact with the respective electrical traces and forming a plurality of solder columns. The outer surface of the reconstituted wafer is then planarized, and a second redistribution layer is formed on the planarized surface. The solder columns serve as through-vias, electrically coupling the first and second redistribution layers on opposite sides of the reconstituted wafer.

25 Claims, 7 Drawing Sheets

(56) References Cited

U.S. PATENT DOCUMENTS

| | | | |
|---|---|---|---|
| 4,715,115 | A | 12/1987 | King et al. |
| 5,222,014 | A | 6/1993 | Lin |
| 5,309,011 | A | 5/1994 | Tazunoki et al. |
| 5,355,580 | A | 10/1994 | Tsukada |
| 5,488,200 | A | 1/1996 | Tsukada |
| 5,936,843 | A | 8/1999 | Ohshima et al. |
| 6,188,127 | B1 | 2/2001 | Senba et al. |
| 6,253,992 | B1 | 7/2001 | Fjelstad |
| 6,271,469 | B1 | 8/2001 | Ma et al. |
| 6,344,682 | B1 | 2/2002 | Tomita |
| 6,350,668 | B1 | 2/2002 | Chakravorty |
| 6,680,529 | B2 | 1/2004 | Chen et al. |
| 6,717,245 | B1 | 4/2004 | Kinsman et al. |
| 6,815,254 | B2 | 11/2004 | Mistry et al. |
| 6,828,665 | B2 | 12/2004 | Pu et al. |
| 6,882,054 | B2 | 4/2005 | Jobetto |
| 6,940,169 | B2 | 9/2005 | Jin et al. |
| 7,045,899 | B2 | 5/2006 | Yamane et al. |
| 7,064,440 | B2 | 6/2006 | Jobetto et al. |
| 7,067,911 | B1 | 6/2006 | Lin et al. |
| 7,122,748 | B2 | 10/2006 | Yamada |
| 7,141,873 | B2 | 11/2006 | Aoyagi |
| 7,192,805 | B2 | 3/2007 | Jobetto |
| 7,193,301 | B2 | 3/2007 | Yamaguchi |
| 7,247,947 | B2 | 7/2007 | Wakabayashi et al. |
| 7,345,361 | B2 | 3/2008 | Mallik et al. |
| 7,388,293 | B2 | 6/2008 | Fukase et al. |
| 7,489,032 | B2 | 2/2009 | Jobetto |
| 7,535,509 | B2 | 5/2009 | Takayama |
| 7,642,128 | B1 | 1/2010 | Lin et al. |
| 7,671,459 | B2 | 3/2010 | Corisis et al. |
| 7,714,453 | B2 | 5/2010 | Khan et al. |
| 7,772,687 | B2 | 8/2010 | Inoue |
| 7,825,520 | B1 | 11/2010 | Longo et al. |
| 7,871,861 | B2 | 1/2011 | Song et al. |
| 7,910,405 | B2 | 3/2011 | Okada et al. |
| 7,932,613 | B2 | 4/2011 | Child |
| 7,989,707 | B2 | 8/2011 | Yamano et al. |
| 8,003,496 | B2 | 8/2011 | Oh et al. |
| 8,004,074 | B2 | 8/2011 | Mori et al. |
| 8,004,092 | B2 | 8/2011 | Lin et al. |
| 8,035,213 | B2 | 10/2011 | Lee et al. |
| 8,089,777 | B2 | 1/2012 | Negishi |
| 8,105,915 | B2 | 1/2012 | Comacho et al. |
| 8,106,495 | B2 | 1/2012 | Kajiki |
| 8,125,066 | B1 | 2/2012 | Kang |
| 8,158,888 | B2 | 4/2012 | Shen et al. |
| 8,159,070 | B2 | 4/2012 | Lin et al. |
| 8,222,964 | B2 | 7/2012 | Avni et al. |
| 8,241,964 | B2 | 8/2012 | Pagaila et al. |
| 8,482,134 | B1 | 7/2013 | Darveaux et al. |
| 8,610,268 | B2 | 12/2013 | Kobayashi et al. |
| 2001/0026010 | A1 | 10/2001 | Horiuchi et al. |
| 2002/0070443 | A1 | 6/2002 | Mu et al. |
| 2004/0033643 | A1 | 2/2004 | Odegard |
| 2005/0098891 | A1 | 5/2005 | Wakabayashi et al. |
| 2005/0242422 | A1 | 11/2005 | Klein et al. |
| 2006/0091521 | A1 | 5/2006 | Cady et al. |
| 2006/0163715 | A1 | 7/2006 | Pendse |
| 2006/0256222 | A1 | 11/2006 | Tsai |
| 2007/0090508 | A1 | 4/2007 | Lin et al. |
| 2008/0017968 | A1 | 1/2008 | Choi et al. |
| 2008/0083988 | A1 | 4/2008 | Lin |
| 2009/0057895 | A1 | 3/2009 | Lin et al. |
| 2009/0127688 | A1 | 5/2009 | Lee et al. |
| 2009/0212412 | A1 | 8/2009 | Yoon |
| 2009/0261466 | A1 | 10/2009 | Pagaila et al. |
| 2009/0309224 | A1 | 12/2009 | Lin et al. |
| 2010/0072600 | A1 | 3/2010 | Gerber |
| 2010/0090323 | A1 | 4/2010 | Shinoda et al. |
| 2010/0117212 | A1 | 5/2010 | Corisis et al. |
| 2010/0148316 | A1 | 6/2010 | Kim et al. |
| 2010/0244216 | A1 | 9/2010 | Huang et al. |
| 2010/0244263 | A1 | 9/2010 | Lin et al. |
| 2011/0024905 | A1 | 2/2011 | Lin et al. |
| 2011/0032400 | A1 | 2/2011 | Yang |
| 2011/0156230 | A1 | 6/2011 | Goh |
| 2011/0156240 | A1 | 6/2011 | Luan et al. |
| 2011/0156250 | A1 | 6/2011 | Goh et al. |
| 2011/0157452 | A1 | 6/2011 | Goh et al. |
| 2011/0157853 | A1 | 6/2011 | Goh |
| 2011/0210413 | A1 | 9/2011 | Huang et al. |
| 2011/0241055 | A1 | 10/2011 | Urasaki et al. |
| 2011/0241192 | A1* | 10/2011 | Ding et al. .................. 257/686 |
| 2011/0260303 | A1 | 10/2011 | Pagaila et al. |
| 2011/0291274 | A1 | 12/2011 | Meyer et al. |
| 2011/0316146 | A1 | 12/2011 | Pagaila et al. |
| 2011/0316156 | A1 | 12/2011 | Pagaila et al. |
| 2012/0049364 | A1 | 3/2012 | Sutardja et al. |
| 2012/0161332 | A1* | 6/2012 | Chua et al. .................. 257/774 |
| 2012/0299191 | A1* | 11/2012 | Camacho ...................... 257/774 |
| 2013/0037929 | A1* | 2/2013 | Essig et al. .................. 257/693 |
| 2013/0105973 | A1 | 5/2013 | Gan et al. |
| 2013/0200528 | A1* | 8/2013 | Lin et al. ...................... 257/774 |

OTHER PUBLICATIONS

Goh et al., "Flip-Chip Fan-Out Wafer Level Package for Package-on-package Applications, and Method of Manufacture," U.S. Appl. No. 12/651,365, filed Dec. 31, 2009, 20 pages.

Jin, "Semiconductor Package with Improved Pillar Bump Process and Structure," U.S. Appl. No. 13/232,780, filed Sep. 14, 2011, 24 pages.

Jin, "Manufacturing Fan-Out Wafer Level Packaging," U.S. Appl. No. 12/330,044, filed Dec. 8, 2008, 39 pages.

Luan et al., "Reliable Large Die Fan-Out Wafer Level Package and Method of Manufacture," U.S. Appl. No. 12/651,362, filed Dec. 31, 2009, 27 pages.

ASE Tech Forum, "ASE PoP (TRD Pop & MAP PoP)," The Advanced Semiconductor Engineering Ground, Sep. 2007, 37 pages.

Goh, "Fan-Out Wafer Level Package with Polymeric Layer for High Reliability," U.S. Appl. No. 12/649,130, filed Dec. 29, 2009, 30 pages.

Jin, "Apparatus and Method for Placing Solder Balls," U.S. Appl. No. 13/340,275, filed Dec. 29, 2011, 31 pages.

Johnson, "STATS ChipPAC Expands eWLB to Reconstituted 300 mm Wafers," *Semiconductor International*, published Apr. 15, 2010, downloaded from http://english.ime.cas.cn/ns/es/201004/t20100429_53569.html, which was published by Microelectronice of Chinese Academy of Sciences, 2007, 2 pages.

* cited by examiner

EMBEDDED WAFER LEVEL PACKAGE FOR 3D AND PACKAGE-ON-PACKAGE APPLICATIONS, AND METHOD OF MANUFACTURE

CROSS-REFERENCE TO RELATED APPLICATION

This application is a continuation-in-part of U.S. patent application Ser. No. 13/287,826, filed Nov. 2, 2011, now pending, which application is incorporated herein by reference in its entirety.

BACKGROUND

1. Technical Field

Embodiments of the disclosed invention are directed to an embedded wafer level package for a semiconductor device, and in particular, to such a device that includes through-connections extending through a package wafer of the device.

2. Description of the Related Art

For manufacturers of semiconductor devices, there is a continuing pressure to increase the density and reduce the size of the devices, so that more devices can be made on a single wafer of semiconductor material, and so that products that incorporate the devices can be made more compact. One response to this pressure has been the development of chip scale packaging and wafer level packaging. These are packages that have a footprint that is very close to the actual area of the semiconductor die. They are generally direct surface mountable, using, e.g., ball grid arrays [BGAs] and flip chip configurations.

Another development is the reconfigured wafer, or reconstituted wafer, in which a semiconductor wafer is separated into individual dice, which are spaced some greater distance apart than on the original wafer and embedded in a layer of molding compound to form the reconfigured wafer. A redistribution layer is formed over the dice to relocate contact points on the new wafer. One benefit is that this provides increased area for each die for "back end" processes, such as the formation of contacts at a scale or pitch that is compatible with circuit board limitations, without sacrificing valuable real estate on the original wafer. Such packages are typically referred to as fan-out wafer level packages, because the contact positions of the original die are "fanned out" to a larger foot print. Typically, such packages are provided with a ball-grid array for coupling to a circuit board, and are referred to as embedded wafer-level ball-grid array (eWLB) packages.

A 3D package is a package in which a plurality of semiconductor dice are stacked vertically within a single package.

A package-on-package (PoP) configuration is a package that has one face configured to be coupled to a circuit board or chip carrier, and an opposite face configured to receive another semiconductor package.

An interposer is an interface structure positioned between a semiconductor device and another element to which the device is coupled. The interposer provides routing of electrical contacts from one side to the other for proper connection.

BRIEF SUMMARY

A method may be summarized as including forming a reconstituted wafer by embedding a first semiconductor die in a first molding compound layer, with a face of the die lying substantially in a first plane with a face of the first molding compound layer; positioning a first redistribution layer on a first surface of the reconstituted wafer, including forming a first plurality of electrically conductive traces with ones of the first plurality of electrically conductive traces in electrical contact with respective ones of a plurality of circuit contacts positioned on the face of the first semiconductor die; drilling a first plurality of apertures in the reconstituted wafer, each extending from a second surface of the reconstituted wafer at least as far as a respective one of the first plurality of electrically conductive traces of the first redistribution layer; and forming, in each of the first plurality of apertures, a respective one of a first plurality of solder columns in electrical contact with the respective one of the first plurality of electrically conductive traces.

Forming, in each of the first plurality of apertures, a respective one of a first plurality of solder columns may include positioning solder on the second surface of the reconstituted wafer adjacent to an opening of each of the first plurality of apertures, and melting the solder positioned on the second surface. The positioning solder step may include positioning a ball of solder on the second surface, or depositing solder paste on the second surface adjacent to the opening of each of the first plurality of apertures. The forming, in each of the first plurality of apertures, a respective one of a first plurality of solder columns may also include drawing a vacuum around the reconstituted wafer, and releasing the vacuum while the solder is molten.

The method may further include thinning the reconstituted wafer by removing material from the second surface of the reconstituted wafer to form a third surface, with an exposed portion of each of the first plurality of solder columns lying in a second plane defined by the third surface; forming a second redistribution layer on the third surface of the reconstituted wafer, including forming a second plurality of electrically conductive traces, with ones of the second plurality of electrically conductive traces in electrical contact with the exposed portion of respective ones of the first plurality of solder columns. The forming a second redistribution layer may include forming a plurality of landing pads, each in electrical contact with a respective one of the second plurality of electrically conductive traces, the method may further include positioning a second semiconductor die over the second redistribution layer; and forming an electrical connection between each of the plurality of landing pads and a respective one of a plurality of circuit contacts positioned on a face of the second semiconductor die. The method may include forming a second molding compound layer over the second redistribution layer, thereby encapsulating the second semiconductor die and forming, on a side of the second molding compound layer opposite the second redistribution layer, a fourth surface of the second molding compound layer lying in a third plane that is substantially parallel to the first plane. The method may include drilling a second plurality of apertures in the second molding compound layer, each extending from the fourth surface at least as far as a respective one of the second plurality of electrically conductive traces; forming, in each of the second plurality of apertures, a respective one of a second plurality of solder columns in electrical contact with the respective one of the second plurality of electrically conductive traces; thinning the second molding compound layer by removing material from the fourth surface to form a fifth surface of the second molding compound layer, with an exposed portion of each of the second plurality of solder columns lying in a fourth plane defined by the fifth surface; forming a third redistribution layer on the fifth surface of the second molding compound layer, including forming a third plurality of electrically conductive traces, with ones of the third plurality of electrically conductive traces in electrical contact with the exposed portion of a respective one of the second plurality of solder columns. The forming a first redistribution layer may include forming a plurality of contact pads on a side of the first redistribution layer opposite the reconstituted wafer, with each of the plurality of contact pads in electrical contact with a respective one of the first plurality of electrically conductive traces. The method may include positioning solder on each of the plurality of contact pads.

A device may be summarized as including a reconstituted wafer having first and second surfaces lying substantially in first and second planes, respectively, the reconstituted wafer including a first molding compound layer and a first semiconductor die embedded in the first molding compound layer, with a face of the die and a face of the first molding compound layer lying substantially in the first plane, the first semiconductor die having a first plurality of circuit contacts positioned on the face of the first semiconductor die; a first redistribution layer positioned on the first surface of the reconstituted wafer, and including a first plurality of electrically conductive traces with ones of the first plurality of electrically conductive traces in electrical contact with respective ones of the first plurality of circuit contacts; and a first plurality of substantially cylindrical solder columns, each extending in the reconstituted wafer from the second surface at least as far as a respective one of the first plurality of electrically conductive traces, and in electrical contact therewith.

The device may include a second redistribution layer positioned on the second surface of the reconstituted wafer, and may include a second plurality of electrically conductive traces, with ones of the second plurality of electrically conductive traces in electrical contact with respective ones of the first plurality of substantially cylindrical solder columns; and a first plurality of landing pads, each in electrical contact with a respective one of the second plurality of electrically conductive traces. The device may include a second semiconductor die positioned over the second redistribution layer, with each of the first plurality of landing pads electrically connected to a respective one of a plurality of circuit contacts positioned on a face of the second semiconductor die. The device may include a second molding compound layer positioned on the second redistribution layer and encapsulating the second semiconductor die, the second molding compound layer having a third surface on a side opposite the second redistribution layer. The device may include a second plurality of substantially cylindrical solder columns, each extending in the second molding compound layer from the third surface at least as far as a respective one of the second plurality of electrically conductive traces, and in electrical contact therewith; a third redistribution layer positioned on the third surface, and including: a third plurality of electrically conductive traces, with ones of the third plurality of electrically conductive traces in electrical contact with respective ones of the second plurality of substantially cylindrical solder columns; and a second plurality of landing pads, each in electrical contact with a respective one of the third plurality of electrically conductive traces.

DETAILED DESCRIPTION

Figure 1:
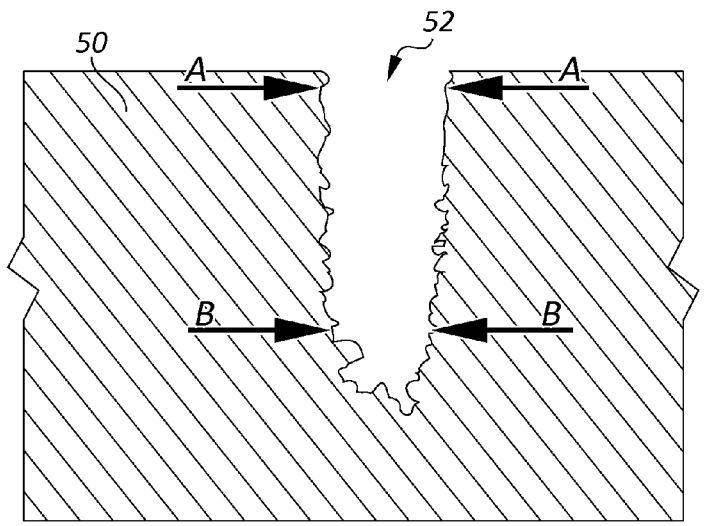
FIG. 1 is a cross section of a portion of a molding compound layer showing a blind aperture formed in the material of the layer.

FIG. 1 is a cross section of a reconstituted wafer showing a portion of a molding compound layer (MCL) 50, which includes a blind aperture 52 formed in the material of the layer. The image was traced from a digital micrograph obtained by the inventors, and shows a representative example of a laser-drilled aperture, such as would be formed in the process of making plated through-holes (PTH) in a reconstituted wafer. At the surface of the layer 50, between arrows A-A, the aperture 52 is about 180 μm in width, the distance between the arrows B-B near the bottom of the aperture is about 140 μm, and the depth of the aperture is about 450 μm.

It can be seen that the walls of the aperture 52 are not smooth, but are rough and pitted. This is because of the operation of the laser drill and the composition of the molding compound used for the reconstituted wafer. A laser drill operates by concentrating energy onto a very small point of the material to be drilled, and heating the material at that point until it vaporizes, which exposes new material directly below to be heated. Where the material is substantially homogeneous, such as, e.g., a silicon semiconductor wafer, a relatively smooth hole is bored into the material. This is because the rate at which the material absorbs and transmits heat is substantially constant, so the rate of progress of the laser through the material is substantially constant, and the amount of material surrounding the actual point of impact that is removed because of transmitted heat remains consistent.

However, the molding compound as used for a reconstituted wafer is not homogeneous. Molding compound for this use generally includes an epoxy matrix material of about 10%-45%, and a silica filler of about 50%-85%. Other additives, such as catalyst, hardener, color, etc., usually make up about 5%-15%. The molding compound for the reconstituted wafer can be made of different materials than this, but is usually a blend of various substances selected to contribute specific characteristics to the final mix, according to its intended use.

In the material used for the reconstituted wafer, the silica is a powder with particles that average about 25 μm across. As the laser strikes a portion of the MCL, the epoxy matrix material, which vaporizes at a much lower temperature than the silica, burns away very quickly. Because the epoxy is a poor thermal conductor, little heat is transmitted by the epoxy, so very little of the epoxy material that is not directly under the beam is affected. On the other hand, the silica particles melt and vaporize at higher temperatures than the epoxy, and are also more thermally conductive. As a result, when the laser strikes a portion of a silica grain that extends into the path of the laser, the laser does not instantly slice away that portion of the grain. Instead, the entire grain tends to heat, then vaporize, leaving a cavity in the side wall of the hole. Meanwhile, the grain is insulated from adjacent grains by the epoxy matrix, so that little of the heat is transmitted from one grain to another. The result is a pitted surface, as shown in FIG. 1.

Formation of a through-silicon-via (TSV) in a semiconductor substrate, or a PTH in a circuit board, involves laser drilling a hole through the material, then plating the interior of the hole with a conductive metal, typically copper. Forming a copper layer on the non-conductive surface of a through-hole generally involves forming a seed layer by chemical vapor deposition, followed by electroplating to thicken the layer. This is the also the process typically employed for formation of conductive vias in a reconstituted wafer. The inventors have found that obtaining an adequate seed layer deposition in openings drilled into MCLs can require a longer duration of chemical vapor deposition than expected, and is subject to a higher failure rate than is typical for such operations. The inventors have determined that this is because of the rough and pitted side walls of the holes, as described above. The discontinuous surfaces interfere with formation of an electrically continuous seed layer, as is required to enable subsequent electroplating. One solution is to thicken the seed layer, but this extends the time and expense of the process. Various embodiments described herein are directed to semiconductor packages that include conductive vias in MCLs.

FIGS. 2-6 are diagrammatical side views of a portion of a wafer, showing a package 100 at various stages of manufacture. Typically, a large plurality of packages are manufactured on a wafer, which is cut into individual packages when the manufacturing process is complete or nearly so. However, for ease of illustration and comprehension, only one of the packages 100 is shown in detail, the other packages being substantially identical.

Figure 2:
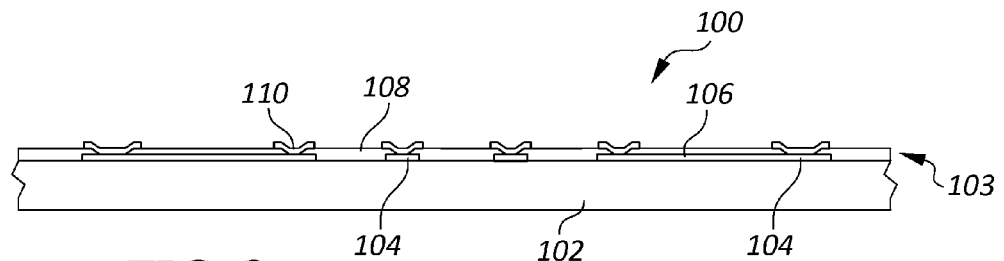
FIGS. 2-5 are diagrammatical side views of a portion of a wafer, showing respective stages of manufacture of a single semiconductor package on the wafer, according to an embodiment.

FIG. 2 shows a support substrate 102, which is preferably a semiconductor material, such as, e.g., silicon, and on which a first redistribution layer (RDL) 103 is formed. The first RDL 103 includes an electrically conductive layer 105 that is deposited and patterned to form contact pads 104 and electrical traces 106. A dielectric layer 108 is deposited over the conductive layer 105 and patterned to form openings over the contact pads 104. An under-ball metallic (UBM) layer is deposited and patterned to define contact/landing pads 110 configured to receive solder ball contacts. The first RDL 103 can include additional layers, according to the specific design of the device and the materials used. For example, if the substrate 102 is electrically conductive, an insulating layer will be formed over the substrate, after which the layer for contact pads 104 and traces 106 is formed as part of the first RDL 103. Likewise, additional conductive layers, passivation layers, insulative layers, etc. can be provided, as necessary.

Figure 3:
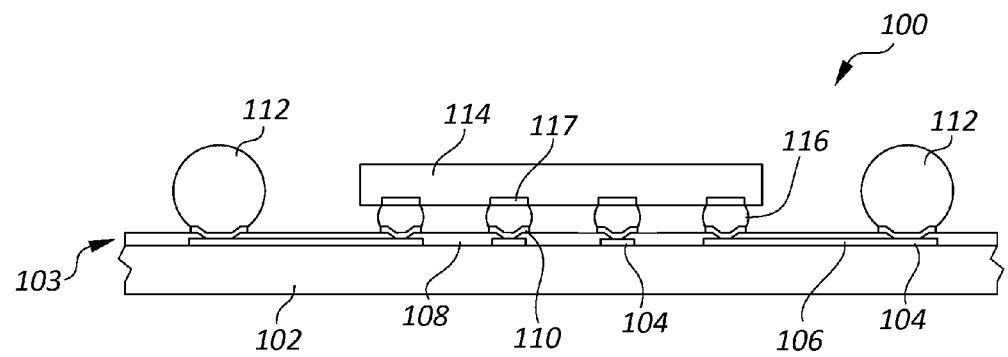

FIG. 3 shows solder balls 112, which are placed on the substrate 102 at selected ones of the contact pads 104. A semiconductor die 114, having circuit pads 117 on which micro-bumps 116 are positioned in a flip-chip configuration, is positioned with each of the micro-bumps 116 in contact with a respective one of the contact pads 104. The substrate 102 is then heated to reflow the solder balls 112 and micro-bumps 116. Typically, a large number of dice are coupled to a single substrate 102 in this manner, each of which will become part of a respective semiconductor package when the substrate is cut into individual packages. For the sake of simplicity, only one die 114 is shown in the drawings. However, in practice, the number of dice that are coupled to the substrate 102 can number in the hundreds.

Figure 4:
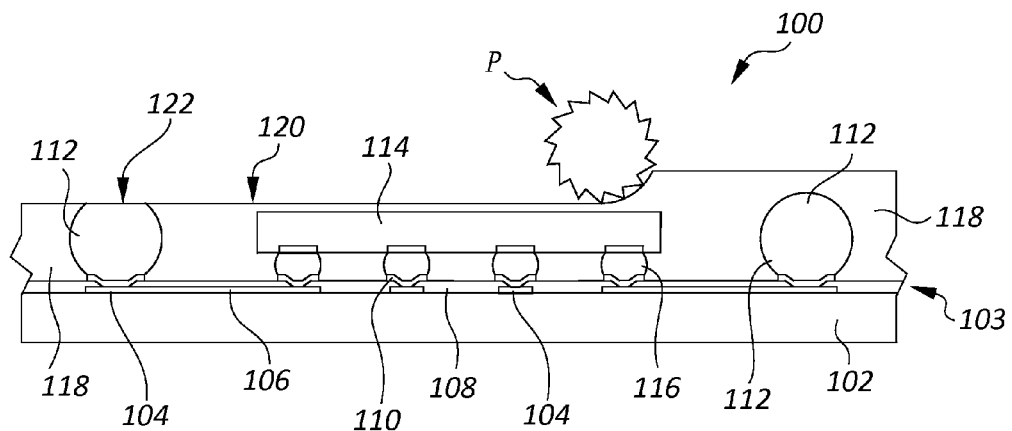

Following the reflow step, as shown in FIG. 4, an MCL 118 is formed over the substrate 102, encapsulating the semiconductor die 114 and the solder balls 112. After the MCL 118 is cured, it is planarized, as indicated at P in FIG. 4, to reduce its thickness. The planarizing process leaves a surface 120 on the MCL 118 and removes a small portion of each of the solder balls 112, resulting in pads 122 being formed at the surface 120 of the MCL 118. The MCL 118 can be planarized by any appropriate process, such as mechanical polishing, chemical etch, CMP, grinding, or any acceptable process.

Figure 5:
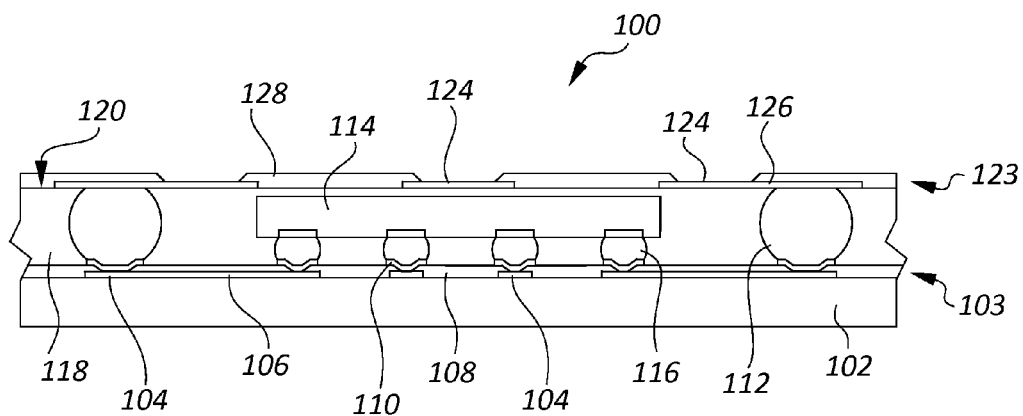

As shown in FIG. 5, a second RDL 123 is formed on the surface 120 of the MCL 118, and includes, in the embodiment shown, contact pads 124, electrical traces 126, and a dielectric layer 128. The electrical traces 126 are positioned to make contact with the pads 122 so as to place the solder balls 112 in electrical contact with respective contact pads 124.

Figure 6:
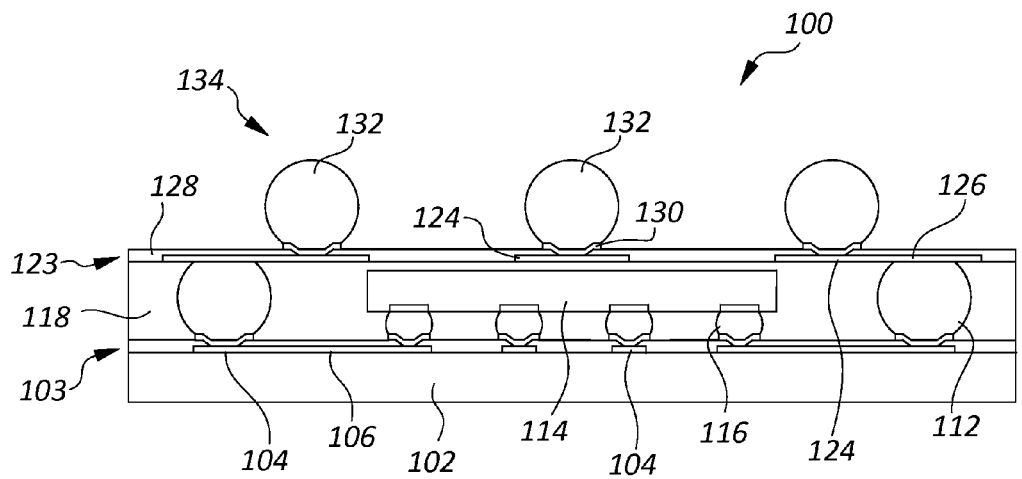
FIG. 6 is a diagrammatical side view of the finished package of the embodiment of FIGS. 2-5.

Turning to FIG. 6, a UBM layer 130 is then deposited and patterned over the contact pads 124, and solder balls 132 are positioned on the pads. The solder balls 132 are reflowed to adhere them to the contact pads 124, forming a ball grid array 134. The wafer is then singulated to form individual packages 100. Thus, in FIG. 6 the package 100 is shown with cut edges, indicating that it has been separated from the original wafer.

The package 100 provides a number of advantages over conventional eWLB packages. For example, where the substrate 102 and the semiconductor die 114 are made from the same material, such as silicon, they will both have the same coefficient of thermal expansion, which eliminates problems associated with different rates of expansion between semiconductor dies and substrates or circuit boards. The solder balls 132 that will be coupled to a circuit board are not directly coupled to contact pads of the semiconductor dies, so the die is not subjected to the stresses associated with the temperature differentials. Additionally, the silicon substrate 102 is more thermally conductive than most molding compounds, so it is able to draw heat from the silicon die more efficiently (via the micro-bumps 116), and to transmit the heat to its opposite face to be disposed of by various known means. Configured as shown in the embodiment of FIGS. 2-6, the substrate 102 is on the side of the package opposite the BGA 134, and so can act as a heat sink to draw heat from the die 114 for dissipation by active or passive cooling. Heat is also transmitted to the underlying circuit board via the BGA 134, which is adjacent the back side of the die 114.

Another advantage is related to the solder balls 112 by which the first RDL 103 is coupled to the second RDL 123. As explained with reference to FIG. 1, through-holes formed in a molding compound wafer tend to have rough surfaces that do not readily accept plating for formation of through-vias. Where structures provide through-vias that are formed in an MCL by methods corresponding to known processes of forming TSVs, the manufacture of such vias is difficult and often unsuccessful. In contrast, the solder balls 112 are not subject to such problems, but provide very reliable through-connections.

Figure 7:
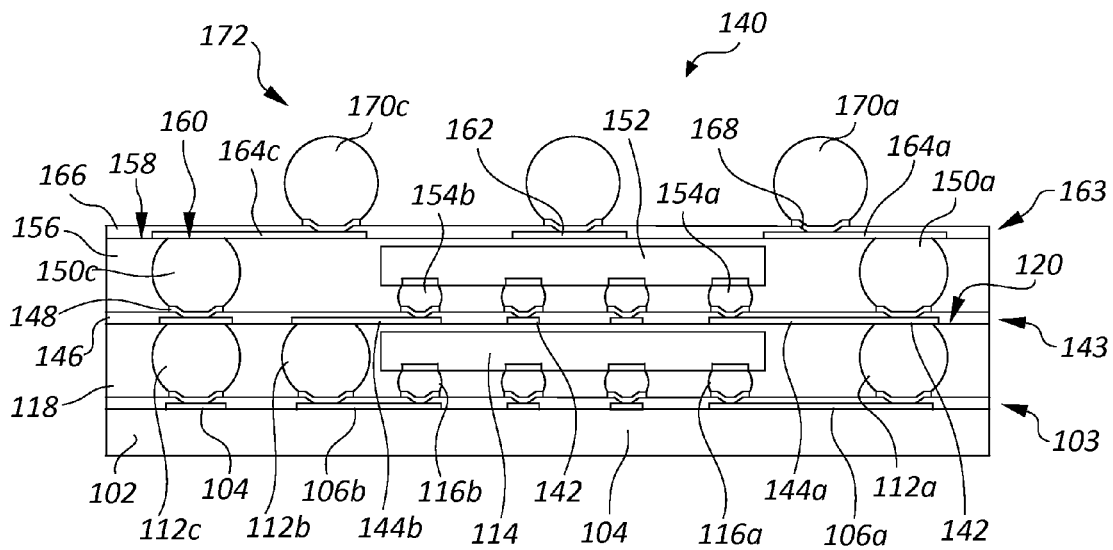
FIG. 7 is a diagrammatical side view of a semiconductor package according to another embodiment.

Turning now to FIG. 7, a completed 3D package 140 is shown, according to another embodiment, in which multiple dies are stacked. The method for manufacturing the package 140 is substantially identical to that of the package 100 through the planarization process described with reference to FIG. 4. Following the planarization process, a second RDL 143 is deposited on the surface 120 of the MCL 118. The second RDL 143 is, in many respects, similar to the second RDL 123 described with reference to FIGS. 5 and 6, and includes a plurality of contact pads 142, electrical traces 144, and a dielectric layer 146. In addition to contact pads 142 configured to receive solder balls 150, however, the plurality of contact pads 142 of the package 140 includes landing pads configured to receive micro-bumps 154 of a second semiconductor die 152. Following placement of the solder balls 150 and the second die 152, and reflow of the solder balls and micro-bumps 154, a second MCL 156 is deposited and cured substantially as described with reference to the MCL 118. A second planarizing step is then performed, forming planarized surface 158 and creating pads 160 of the solder balls 150, substantially as described with reference to FIG. 4.

A third RDL 163 is then formed, substantially as described with reference to the second RDL 123 of FIGS. 5 and 6. The third RDL 163 includes contact pads 162, electrical traces 164 that electrically couple the contact pads to the pads 160 of the solder balls 150, a dielectric layer 166, and a UBM layer 168. Solder balls 170 are placed and reflowed to form a ball grid array 172. At the conclusion of all these steps, the individual packages are singulated to provide the final single package of FIG. 7.

While no attempt is made to show all of the possible configurations of connections that can be made in and between the various levels of the packages of the embodiments disclosed, a few are shown by way of example. With reference to the package 140 of FIG. 7, an electrical trace 106a is shown coupled between a micro-bump 116a and a solder ball 112a. In the next layer, a trace 144a is deposited over and in contact with the solder ball 112a, and is coupled between a micro-bump 154a and a solder ball 150a. Meanwhile, in the RDL 163, an electrical trace 164a is deposited over and in contact with the solder ball 150a, and is coupled to a solder ball 170a. Thus, it can be seen that the micro-bumps 116a and 154a are coupled to each other as well as to the solder ball 170a, by which they will be electrically coupled directly to a trace or component on a circuit board when the package 140 is mounted. A similar arrangement is shown with reference to micro-bumps 116b and 154b, which are electrically coupled to each other via an electrical trace 106b, a solder ball 112b, and an electrical trace 144b. However, there is no solder ball 150 shown in electrical contact with the electrical trace 144b, so the micro-bumps 116b and 154b are isolated from any direct connection to the circuit board via solder balls 170 on the third RDL 163. The circuit pads on the die 114 and the second die 152 are therefore directly coupled to each other without any part of the electrical path being outside the package.

As a further example, solder balls 112c and 150c are shown stacked above and in electrical contact with each other, and with solder ball 170c via electrical trace 164c, but no electrical contact is shown between either of the solder balls 112c or 150c and any other element, apart from the solder ball 170c. Of course such contact can be provided by electrical traces located outside the visible plane of FIG. 7, to connect one or both solder balls to respective micro-bumps. Additionally, such stacked connections can be used to route signal paths around obstacles in a given RDL. For example, in some circuit designs, a connection between two points on a same layer can be impossible to make via an electrical trace because of a particular circuit pattern that completely blocks any passage. In such a case, it is generally necessary to deposit another conductive layer over the dielectric layer of the RDL and define additional traces that bridge the obstruction. However, with this invention, by routing the signal path from one layer to another, then back to the one layer at another location, it may be possible to avoid the expense of depositing and defining additional conductive and dielectric layers.

On the basis of the principles disclosed herein, embodiments that include three or more semiconductor dies stacked in a single 3D package can be produced, and reliable interconnections provided.

Figure 8:
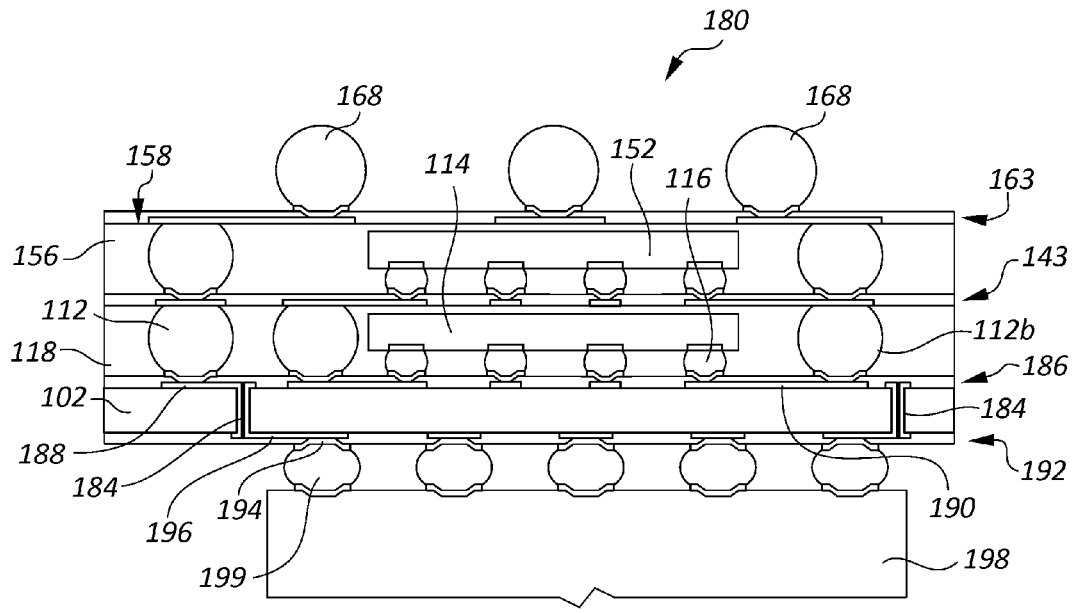
FIG. 8 is a diagrammatical side view of a semiconductor package according to a further embodiment.
Figure 9:
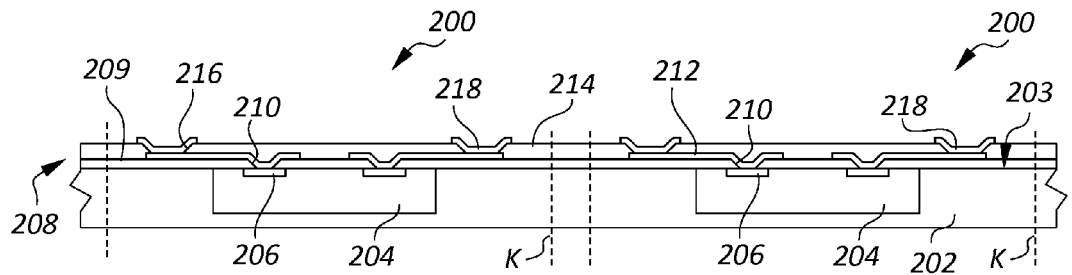
FIGS. 9-15 are diagrammatical side views of a portion of a wafer, showing respective stages of manufacture of a pair of semiconductor packages on the wafer, according to another embodiment.

FIG. 8 is a side diagrammatical representation of a semiconductor device package 180 according to another embodiment. In many respects, the package 180 of FIG. 8 is substantially identical to the package 140 of FIG. 7, and the method of manufacture likewise includes elements that correspond to those previously described with reference to the embodiments of FIGS. 2-7. In the package 180 the substrate 102 is configured to serve as an interposer, providing interface connections for placement of an additional package 198.

Prior to performing the process that corresponds to formation of the first RDL 103, described with reference to FIG. 2, TSVs 184 are formed in the silicon substrate 102 in accordance with well known processes, which include drilling and plating apertures in the silicon substrate 102. Following formation of the TSVs 184, a first RDL 186 is formed substantially as described with reference to FIG. 2, except that, in addition to coupling micro-bumps 116 to respective solder bumps 112, electrical traces 196 also connect the micro-bumps and/or solder bumps to the TSVs, according to selected patterns and arrangements. An additional RDL 192 is formed on the opposite face of the silicon substrate 102, including deposition and patterning of a conductive layer to form contact pads 194 and electrical traces 196. The traces 196 place the contact pads in electrical contact with respective ones of the TSVs 184. A UBM layer is formed and defined over the contact pads 194, which will act as landing pads for solder bumps 199 of the semiconductor package 198.

Formation of additional elements of the package 180, including MCLs 118, 156, and second and third RDLs 143, 163, etc., is performed substantially as described above with reference to previous embodiments, and so will not be described in detail.

According to an alternative embodiment, a package is produced that is similar to the package 180 of FIG. 8, except that contact pads 194 are positioned to receive a ball-grid-array on the RDL 192 for connection to a circuit board. RDL 163 can be configured to receive a separate package, in a package-on-package configuration, or, according to other embodiments, can be entirely omitted.

FIGS. 9-15 are diagrammatical side views of a portion of a reconstituted wafer 202, showing respective stages of manufacture of a pair of semiconductor packages 200 on the wafer, according to an embodiment. Kerf lines K show where the wafer 202 will eventually be cut into separate packages 200.

Each package 200 includes a semiconductor die 204 embedded in the molding compound of the wafer 202. A fan-out RDL 208 is positioned on a front face 203 of the wafer 202. To make the RDL 208, a first dielectric layer 209 is deposited, and patterned to define openings 210 over respective circuit pads 206 of the semiconductor die 204. A conductive layer is then deposited over the first dielectric layer, and patterned to define electrical traces 212, each in electrical contact with a respective circuit pad 206 via the openings 210. A second dielectric layer 214 is deposited over the conductive layer, and patterned to define openings 216 over the electrical traces 212 for contact pads 218.

Figure 10:
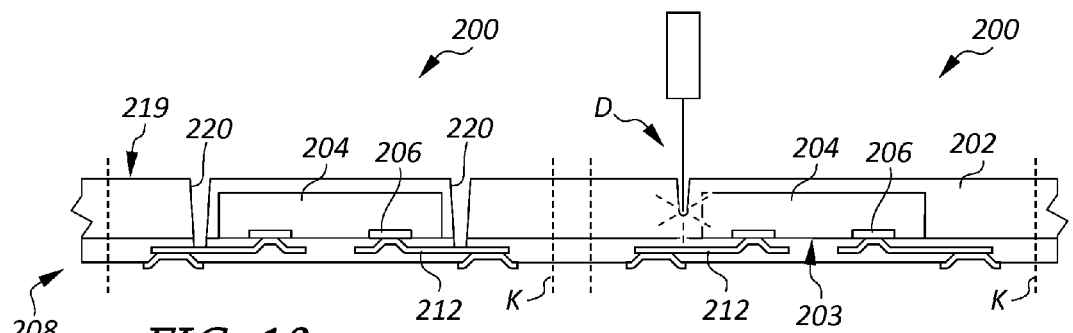

Following formation of the RDL 208, as shown in FIG. 10, blind apertures 220 are drilled in the wafer 202 by laser from the back side 219, as shown at D. Each aperture 220 extends from the back side 219 at least as far as a respective one of the electrical traces 212 on the front face 203 of the wafer 202.

Preferably, the apertures 220 extend only as far as the respective electrical traces 212, so that the electrical traces extend substantially unbroken across the bottom of the aperture. This provides a broad surface for solder to adhere to in a later step of the process. However, even where the laser drills through an electrical trace, a substantial surface of the electrical trace can be exposed within the aperture, to provide a surface for solder to adhere to.

As explained with reference to FIG. 1, when a laser contacts a material to be drilled, it affects the material in different ways, according to the thermal conductivity of the material and its boiling, or vaporizing temperature. Polyimide is typically used as a dielectric in RDL formation while copper is generally used to form electrical traces. Polyimide has a thermal conductivity of about 0.52 W/(m·K), and a vaporization temperature of around 400° C. Copper has a thermal conductivity of about 400 W/(m·K), and vaporizes at around 2,500° C. Thus, when a laser contacts an RDL, the polyimide dielectric, which covers the copper traces on both sides, does not carry heat away from the contact point, and quickly vaporizes directly under the laser to expose the copper. Because the copper is highly thermally conductive, it carries heat away from the immediate contact point, so that it heats relatively more slowly. Additionally, as it heats in the area surrounding the contact point, the heat is transferred to the polyimide dielectric that is in direct contact with the copper, which vaporizes in a larger area around the contact point, exposing a larger surface of the copper. Furthermore, as the polyimide boils away, it helps to hold the temperature of the copper down, so that it does not immediately reach its own vaporization temperature. By careful control of the power of the laser, and duration of the drill process, the copper trace can be left substantially intact at the bottom of the aperture, or with a relatively large surface exposed for contact with solder that is to be applied in a subsequent step.

Figure 11:
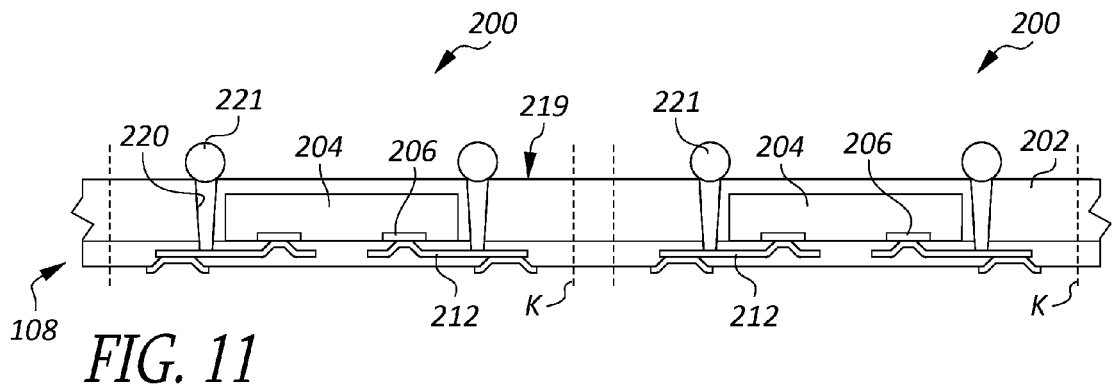

Following the drilling step, a solder ball 221 is placed adjacent to each of the apertures 220, as shown in FIG. 11. Placement of the solder balls 221 can be performed using any of a number of known methods. For example, solder balls 221 can be positioned by a known pick-and-place mechanism. Alternatively, a sacrificial resist layer can be deposited and patterned on the back side 219 of the wafer 202 to guide solder balls into position, as described in U.S. patent application Ser. No. 13/232,780, filed Sep. 14, 2011, and incorporated herein by reference in its entirety.

Alternatively, a quantity of solder can be placed adjacent to each aperture 220 using other known methods, including, e.g., in the form of solder paste. Solder paste can be applied by various means, including screen process printing.

Figure 12:
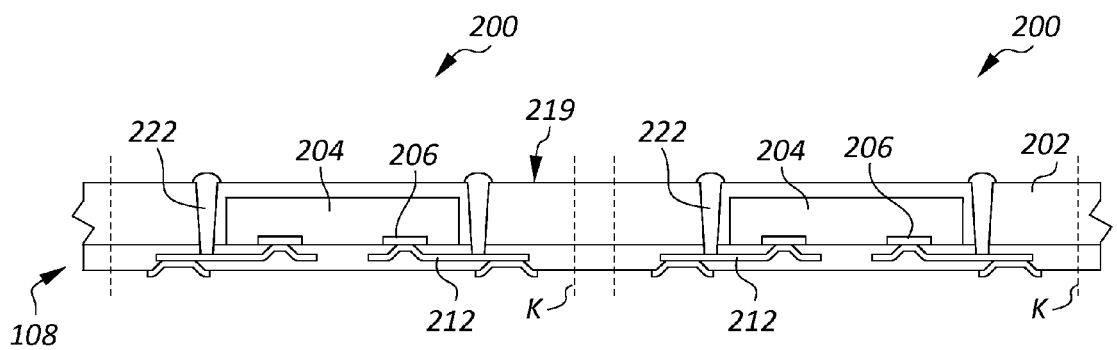

Following placement of the solder balls 221, the wafer 202 is heated to melt and reflow the solder balls 221, causing the solder to flow down into the apertures 220. According to an embodiment, the reflow step is performed under vacuum conditions, i.e., the wafer 202 is placed in a chamber from which the atmosphere is removed, resulting in a substantial vacuum. Heat is then applied until the solder balls 221 melt. Because many of the types of materials used for molding compound and to form reconstituted wafers are not readily wetted by molten solder, the solder balls 221 may form puddles of solder over each aperture 220 without flowing into the aperture. Accordingly, while the solder balls 221 are molten, the vacuum is removed. This causes the molten solder to be forced by the returning atmospheric pressure down into the apertures, which are covered by the solder so that they retain a vacuum. As the solder is drawn into the apertures by the pressure differential, it makes contact with the electrical traces 212, to which it bonds as it cools. When the solder cools, it forms solder columns 222 extending through the reconstituted wafer 202, as shown in FIG. 12.

Figure 13:
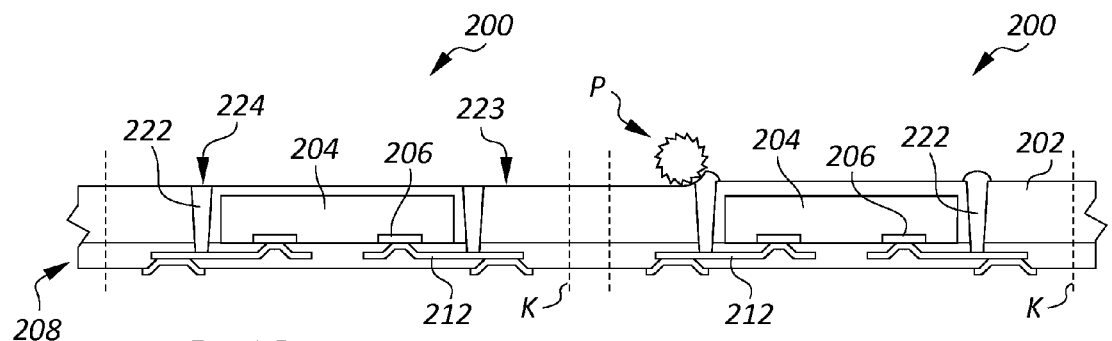

Comparing the solder columns 222 of FIG. 13 with the encapsulated solder balls 112 of FIG. 3, it can be seen that the solder columns occupy much less space than solder balls of a comparable height, and also require much less metal. Thus, other design considerations being equal, a package that has through-vias in the form of solder columns may be smaller than a package using solder balls, and will require a fraction of the solder material, as well as the other materials used to make the larger RDL. Although apertures formed by laser drilling may have a slight taper, the apertures 220 and solder columns 222 can be described as being substantially cylindrical.

Following formation of solder columns 222, the back side 219 of the reconstituted wafer 202 is planarized, as shown at P in FIG. 13. The planarizing step thins the wafer 202, and removes any portions of the solder columns 222 that extend from the apertures 220, leaving a planarized back surface 223 on the back side of the wafer 202, with solder pads 224.

Figure 14:
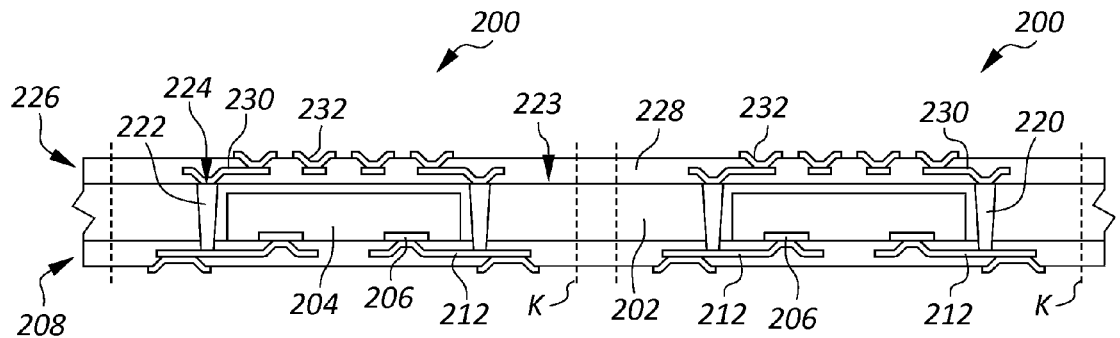

Turning to FIG. 14, a second RDL 226 is then formed on the back surface 223 including dielectric layers 228, electrical traces 230 in electrical contact with respective ones of the solder pads 224, and landing pads 232, which are electrically coupled to the circuit pads 206 of the die 204 via the electrical traces 230, the solder columns 222, and the electrical traces 212. Formation of the second RDL will not be described in detail, inasmuch as other RDL layers are more fully described above, and are well understood in the art.

Figure 15:
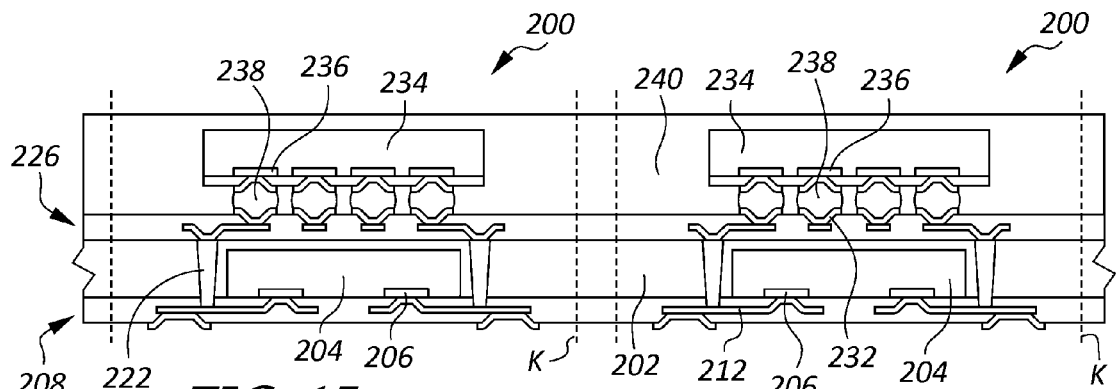

As shown in FIG. 15, following formation of the landing pads 232, second semiconductor dies 234, in a BGA flip-chip configuration, are positioned over the second RDL 226 with solder balls 238 positioned to couple circuit pads 236 of the second semiconductor dies to landing pads 232. The solder balls 238 are reflowed, and a second MCL 240 is then formed on the wafer 202, fully encapsulating the second semiconductor dies 234.

Figure 16:
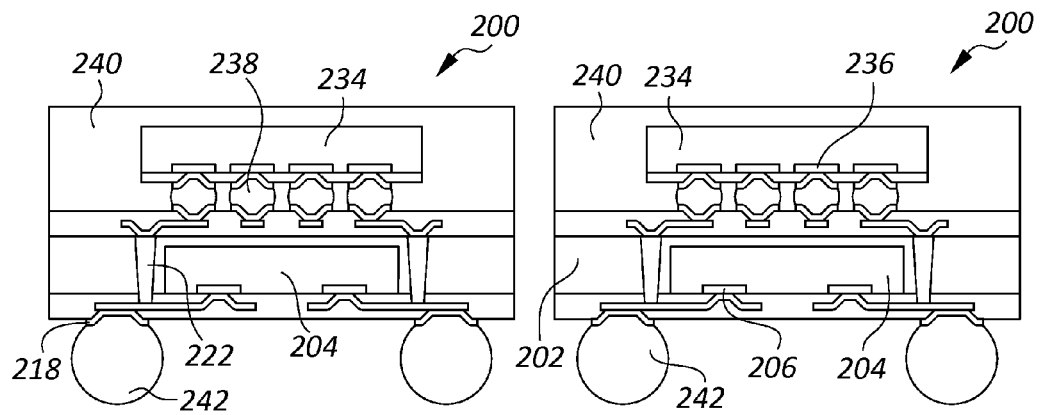
FIG. 16 is a diagrammatical side view of the finished packages of the embodiment of FIGS. 9-15.

FIG. 16 is a diagrammatical side view of the finished packages of the embodiment of FIGS. 9-15. As shown in FIG. 16, solder balls 242 are positioned on contact pads 218 and reflowed, and the wafer 202 is cut between kerf lines K, separating the wafer into individual 3D packages 200. Each 3D package 200 includes a pair of stacked semiconductor dies, as shown.

Figure 17:
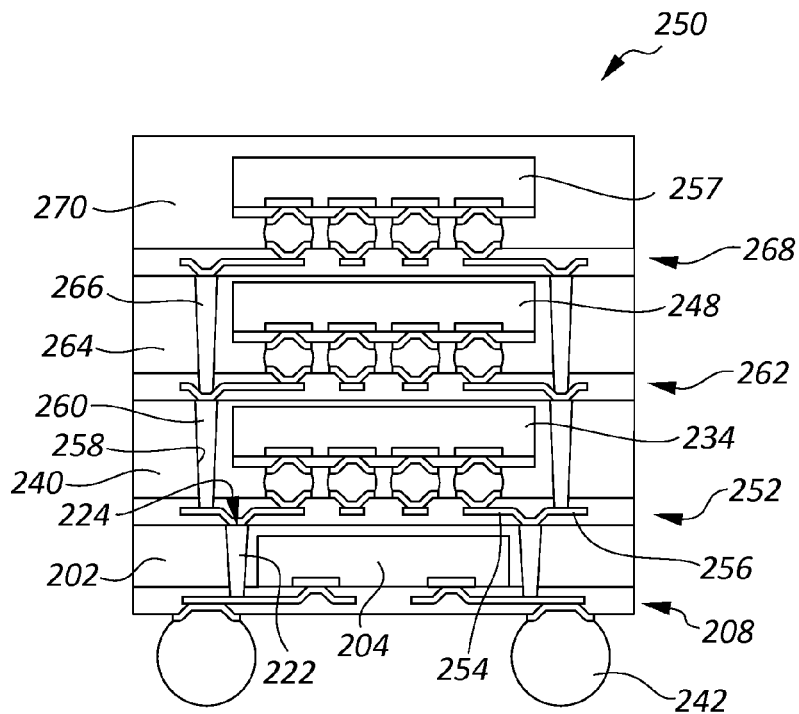
FIGS. 17 and 18 are diagrammatical side views of semiconductor packages according to respective further embodiments.
Figure 18:
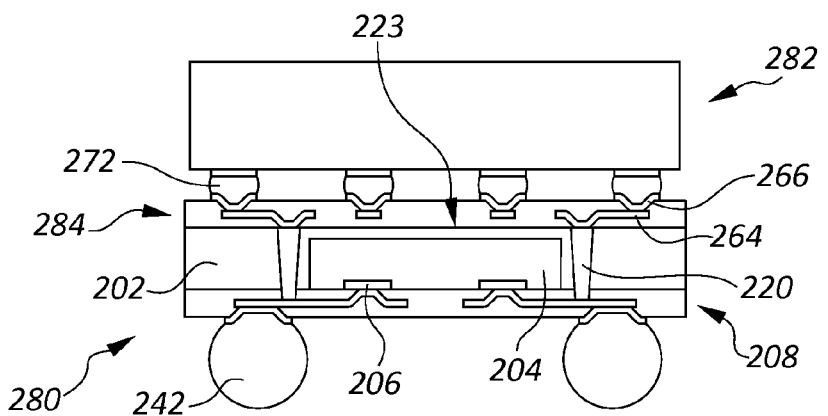

FIGS. 17 and 18 are side diagrammatical views of completed semiconductor packages 250, 280 according to respective further embodiments. Manufacturing processes are described below with reference to the single packages shown, although in practice, a large number of packages will typically be manufactured on a single reconstituted wafer, as previously described.

The package 250 of FIG. 17 is a 3D package manufactured according to the principles disclosed with reference to FIGS. 9-16 that includes four semiconductor dice 204, 234, 248, 257. According to an embodiment, the manufacturing process is substantially identical to the process described with reference to the package 200 through the steps described with reference to FIG. 13. As with the previously described process, a second RDL 252 is formed on the back surface 223 of the reconstituted wafer 202. In the case of the package 250 of FIG. 17, selected ones of the electrical traces 254 of the second RDL 252 include extensions 256, which are positioned for later formation of electrical connections with succeeding layers of the package. In other respects, the second RDL 252 is substantially similar to the second RDL 226 of the package 200, i.e., the second RDL 252 includes dielectric layers 228, electrical traces 254 in electrical contact with respective ones of the solder pads 224, and landing pads 232, which are electrically coupled to the circuit pads 206 of the die 204 via the electrical traces 254, the solder columns 222, and the electrical traces 212.

Following formation of the second RDL 252, the second die 234 is emplaced, substantially as described with reference to FIG. 15. A second MCL 240 is then formed, which fully encapsulates the second semiconductor die 234, similarly to the formation of the second MCL 240 of the package 200. However, in the case of the package 250, the second MCL 240 is also laser drilled, as described with reference to the reconstituted wafer 202 and shown in FIG. 10, to produce blind apertures 258. The apertures 258 extend through the second MCL 240 and into the second RDL 242 at least as far as the electrical traces 254, where they intersect the extensions 256 of the second RDL 252.

Solder columns 260 are then formed and the second MCL 240 is planarized, as previously described. Succeeding steps will be self-explanatory, based on the diagram of FIG. 17 and the foregoing description: a third RDL 262 is formed, the third semiconductor die 248 is emplaced, a third MCL 264 is formed and drilled, solder columns 266 are formed, and the third RDL 262 is planarized, all substantially as previously described. Finally, a fourth RDL 268 is formed over the third MCL 264 and the fourth semiconductor die 257 is emplaced and encapsulated in a fourth MCL 270.

FIG. 17 shows an example of a 3D wafer-level package that includes more than two semiconductor dice, manufactured according to the principles disclosed with reference to the embodiment of FIGS. 9-16. Of course, the embodiment of FIG. 17 is only an example. Based on the principles disclosed, a person having skill in the art will recognize that packages having many more layers can be produced.

Turning now to FIG. 18, a semiconductor package 280 is shown, in a package-on-package (PoP) configuration, with a second package 282 coupled to the package 280. The semiconductor package 280 is manufactured according to the principles disclosed with reference to FIGS. 9-16. According to an embodiment, the manufacturing process is substantially identical to the process described with reference to the package 200 through the steps described with reference to FIG. 13. Following planarization of the reconstituted wafer 202, a second RDL 284 is formed on the back surface 223 of the reconstituted wafer 202. The second RDL 284 is substantially similar to the second RDL 226 of the package 200. Both include dielectric layers, electrical traces and landing pads configured to receive solder balls of an additional semiconductor die. The primary difference between the second RDL 226 of the package 200 and the second RDL 284 of the package 280 is that, in the latter case, the second RDL 284 is configured as the final layer of the package 280. It must therefore be configured to tolerate unpredictable exposure and handling. This may require, e.g., thicker and stronger dielectric layers, UBM layers formulated to have increased resistance to oxidation, or additional passivation layers. The determination of any additional protective measures that may be required will depend on the particular package design and expected end use environment.

This is in contrast to the second RDL 226 of the package 200, which is designed and manufactured with the understanding that in subsequent process steps, it will be sealed by the second MCL 240, and may therefore be optimized to reduce thickness or minimize materials usage.

The devices of the disclosed embodiments include a number of solder connectors that are subject to reflow processes. In one embodiment, each solder connection is reflowed at a separate time. For example, referring to the embodiment of FIG. 6, a first reflow step is performed to reflow solder balls 112 and micro-bumps 116. A second reflow is performed to reflow solder balls 150 and micro-bumps 154. A third reflow is performed to reflow solder balls 170, and, finally, the solder balls 170 are subjected to another reflow when the package 140 is eventually coupled to a circuit board. According to one embodiment, the alloy selected for each successive layer of solder balls/micro-bumps is selected to melt at a lower temperature than the alloy of the preceding layer. During reflow, the package is heated to a temperature sufficient to melt and reflow the solder of that layer, but not the solder of preceding layers.

According to another embodiment, during the reflow process, heat is applied locally, so that only the portions of the package in contact with the solder elements to be reflowed are heated to the reflow temperature. Other portions remain below the reflow temperature, and other solder elements are not remelted, even though the same solder alloy is used for all layers. Alternatively, the material of the MCL 118 is selected to act as a thermal barrier to keep the micro-bumps 116 from reflowing while the solder balls 132 are reflowed. Heat is applied for a time period sufficiently short to keep the micro-bumps 116 below their reflow temperature. According to a further alternative, the entire package can be reflowed at one time, in a single step, by taking it to a high temperature and holding it there for a longer time period.

The embodiments of the present disclosure, in which the redistribution layers are shown with a single conductive layer and one or two dielectric layers, are merely exemplary. Formation of redistribution layers is well known in the art, and can include multiple conductive layers, dielectric layers, passivation layers, etc. Furthermore, selection of the location of the various elements, including vias, contact pads, and electrical traces, is a design choice that is made according to the intended interconnections of a particular device.

The term redistribution layer is sometimes used in the art to refer to a single conductive layer, while at other times it is used so broadly as to refer to any related structure, including support substrates, laminate strips and bases, etc. For the purposes of the present disclosure and claims, redistribution layer is a structure that includes one or more layers of dielectrics and conductors that are formed or otherwise positioned on an underlying substrate or layer to create and isolate redistributing signal paths of a semiconductor die, including a die of a reconstituted wafer. Processes for forming redistribution layers are described in detail in a number of patents and patent applications, including application Ser. No. 12/330,044, filed Dec. 8, 2008; Ser. No. 12/651,365, filed Dec. 31, 2009; Ser. No. 12/651,362, filed Dec. 31, 2009; and Ser. No. 12/977,697, filed Dec. 23, 2010; each of which applications is incorporated herein by reference in its entirety.

Terms such as circuit pads, contact pads, landing pads, etc., are used substantially synonymously to refer to different structures that are functionally, and often structurally, similar. Accordingly, where the claims use such terms, the language is for clarity purposes to identify one element from another and not because they necessarily have different structures, and the corresponding elements are not limited by the terms as used in the description.

Formation of elements such as contact pads, conductive traces, dielectric layers, UBM layers, passivation layers, etc., can be accomplished using many different processes that are very well known in the art. For example, according to one process, a thin metallic seed layer is deposited on a substrate, a positive-acting photosensitive plating resist layer is deposited over the seed layer, a photo mask is positioned over the resist layer, and the resist layer is exposed through the mask to a light source for a prescribed period, so that some portions of the resist layer are prevented from being exposed by the image of the mask. The resist layer is processed to remove the exposed portions of the layer, which in turn exposes the surface of the seed layer at those locations. The substrate is subjected to a plating process, during which a thick layer of metal is plated onto the seed layer in the locations where it is not covered by the resist layer. The resist layer is then removed leaving the plated metal layer in the form of the image. Finally, a chemical etch is performed, during which portions of the metal are dissolved. The timing of the etch process is sufficient to remove the entire thickness of the seed layer, where it was covered during the plating step by the resist, but that removes only a small portion of the thick plated metal material. This process is one of many different processes by which a feature or layer can be formed, and in many cases, the selection of one process over another is merely a design choice, where any of several processes would be satisfactory. In other cases, selection of the process is influenced by factors such as, e.g., materials involved, cost, scale, etc. Because such processes are well known and understood, they will not be described in detail where the choice of process is not material to the disclosure.

The orientation of the elements shown in the drawings is for convenience and clarity, and is not intended to indicate the orientation at which particular processes are performed, or at which the finished packages are mounted to circuit boards or chip carriers.

Devices that are formed on semiconductor material substrates are typically formed on only one surface thereof, and actually occupy a very small part of the total thickness of the substrate. This surface is generally referred to by various terms such as the active, front, or top surface. Likewise, for the purposes of the present disclosure and claims, the terms front and back are used to establish an orientation with reference to a semiconductor wafer or die. For example, where a device includes a semiconductor die, reference to a front surface of some element of the device can be understood as referring to the surface of that element that contains the active surface of the die. Of course, a back surface of a die is the surface that would be opposite, given the same orientation of the device. Use of these terms to refer to an element of such a device is not to be construed as indicating an actual physical orientation of the element, the device, or the associated semiconductor component, and, where used in a claim, does not limit the claim except as explained above.

The term over is used in the specification and claims to refer to the relative positions of two or more elements with respect to a third element, although the third element may be implied by the context. The term on is used to refer to a physical relationship between two elements. Neither term should be construed as requiring direct physical contact between the elements, nor should they be construed as indicating any particular orientation, either absolute, or with respect to the third element. So, for example, if a claim recites a second layer positioned on a substrate over a first layer, this phrase indicates that the second layer is coupled to the substrate and that the first layer is between the second layer and the substrate. It does not indicate that the layers are necessarily in direct physical contact with each other or with the substrate, but may instead have one or more intervening layers or structures. It also does not indicate that the substrate is oriented in a manner that places the second layer physically above the first layer, nor that, for example, the layers are positioned over a front face of the substrate, as that term is used herein.

Ordinal numbers are used in the specification and claims to distinguish between elements so referenced. There is no necessary significance to the value of a number assigned to one element relative to other numbered elements. Furthermore, an ordinal number used to refer to an element in the claims does not necessarily correlate to a number used to refer to an element in the specification on which the claim reads. Nor does an ordinal number used to refer to a given element in one claim necessarily correlate with a number used to refer to a similar or corresponding element in an unrelated claim—obviously, where a claim refers to a numbered element of a claim from which it depends, the numbers will correspond.

The term couple, as used in the claims, includes within its scope indirect coupling, such as when two elements are coupled with one or more intervening elements, even where no intervening elements are recited.

Molding compounds are substances used to encapsulate semiconductor devices in many different packaging processes, are typically composite materials made from blends of ingredients such as, e.g., resins, hardeners, silicas, catalysts, pigments, and release agents, and are generally provided in a substantially liquid form of a selected viscosity so that they can be injected or poured. Molding compounds are available in a very wide range of formulations from different manufacturers and to meet many different criteria. Accordingly, the term molding compound is to be construed broadly to apply to all such compounds. When the intent is to refer to a reconstituted wafer molding compound, as contrasted to and different from an encapsulation molding compound, the specification and claims specifically call out the reconstituted wafer molding compound.

In the drawings, where letters are combined with reference numbers, e.g., 112$a$, the letters are not intended to indicate an element that is functionally or structurally distinct from other elements that are indicated by the same number, but are provided where the description points to one or more specific ones of a plurality of like elements.

The unit symbol "$\mu m$" is used herein to refer to a value in microns. One micron is equal to $1 \times 10^{-6}$ meters.

The abstract of the present disclosure is provided as a brief outline of some of the principles of the invention according to one embodiment, and is not intended as a complete or definitive description of any embodiment thereof, nor should it be relied upon to define terms used in the specification or claims. The abstract does not limit the scope of the claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:
1. A method, comprising:
forming a reconstituted wafer by embedding a first semiconductor die in a first molding compound layer, with a face of the first semiconductor die lying substantially in a first plane with a face of the first molding compound layer of the reconstituted wafer;

positioning a first redistribution layer on a first surface of the reconstituted wafer, including forming a first plurality of electrically conductive traces with ones of the first plurality of electrically conductive traces in electrical contact with respective ones of a plurality of circuit contacts positioned on the face of the first semiconductor die;

drilling a first plurality of apertures into the reconstituted wafer, each extending from a second surface of the reconstituted wafer at least as far as a respective one of the first plurality of electrically conductive traces of the first redistribution layer;

drawing a vacuum around the reconstituted wafer; and filling each of the first plurality of apertures with solder by positioning solder on the second surface of the reconstituted wafer adjacent to an opening of each of the first plurality of apertures, melting the solder positioned on the second surface, and releasing the vacuum while the solder is molten so that the solder fills the apertures, the solder being placed in electrical contact with the respective one of the first plurality of electrically conductive traces.

2. The method of claim 1 wherein the drilling comprises drilling the first plurality of apertures into the reconstituted wafer, each extending from the second surface of the reconstituted wafer only as far as a respective one of the first plurality of electrically conductive traces.

3. The method of claim 1 wherein positioning solder comprises positioning a ball of solder on the second surface of the reconstituted wafer adjacent to the opening of each of the first plurality of apertures.

4. The method of claim 1 wherein positioning solder comprises depositing solder paste on the second surface of the reconstituted wafer adjacent to the opening of each of the first plurality of apertures.

5. The method of claim 1, comprising:
   thinning the reconstituted wafer by removing material from the second surface of the reconstituted wafer to form a third surface of the reconstituted wafer, with an exposed portion of each of the first plurality of solder columns lying in a second plane defined by the third surface;
   forming a second redistribution layer on the third surface of the reconstituted wafer, including forming a second plurality of electrically conductive traces, with ones of the second plurality of electrically conductive traces in electrical contact with the exposed portion of respective ones of the first plurality of solder columns.

6. The method of claim 5 wherein the forming a second redistribution layer includes forming a plurality of landing pads, each in electrical contact with a respective one of the second plurality of electrically conductive traces, the method further comprising:
   positioning a second semiconductor die over the second redistribution layer; and
   forming an electrical connection between each of the plurality of landing pads and a respective one of a plurality of circuit contacts positioned on a face of the second semiconductor die.

7. The method of claim 6, comprising forming a second molding compound layer over the second redistribution layer, thereby encapsulating the second semiconductor die and forming, on a side of the second molding compound layer opposite the second redistribution layer, a fourth surface of the second molding compound layer lying in a third plane that is substantially parallel to the first plane.

8. The method of claim 7, comprising:
   drilling a second plurality of apertures in the second molding compound layer, each extending from the fourth surface at least as far as a respective one of the second plurality of electrically conductive traces;
   forming, in each of the second plurality of apertures, a respective one of a second plurality of solder columns in electrical contact with the respective one of the second plurality of electrically conductive traces;
   thinning the second molding compound layer by removing material from the fourth surface to form a fifth surface of the second molding compound layer, with an exposed portion of each of the second plurality of solder columns lying in a fourth plane defined by the fifth surface;
   forming a third redistribution layer on the fifth surface of the second molding compound layer, including forming a third plurality of electrically conductive traces, with ones of the third plurality of electrically conductive traces in electrical contact with the exposed portion of a respective one of the second plurality of solder columns.

9. The method of claim 1 wherein the forming a first redistribution layer comprises forming a plurality of contact pads on a side of the first redistribution layer opposite the reconstituted wafer, with each of the plurality of contact pads in electrical contact with a respective one of the first plurality of electrically conductive traces.

10. The method of claim 9, comprising positioning solder on each of the plurality of contact pads.

11. A process, comprising:
    drilling a blind aperture into a reconstituted wafer, the aperture extending from a surface of the reconstituted wafer, through a molding compound layer, and into a first redistribution layer at least as far as a first electrical trace in the first redistribution layer; and
    forming a solder column in the blind aperture, with a first end of the solder column in electrical contact with the first electrical trace, and a second end exposed at the surface of the reconstituted wafer, wherein forming the solder column comprises:
      positioning solder on the surface of the reconstituted wafer adjacent to an opening of the blind aperture;
      drawing a vacuum around the reconstituted wafer melting the solder; and
      releasing the vacuum while the solder is molten.

12. The process of claim 11 wherein the drilling comprises drilling the blind aperture only as far as the first electrical trace.

13. The process of claim 11, comprising planarizing the reconstituted wafer by removing material from the surface of the reconstituted wafer, so that a face of the solder column lies in a plane defined by a thinned face of the reconstituted wafer.

14. The process of claim 13, comprising forming a second redistribution layer on the thinned face of the reconstituted wafer, including forming a second electrical trace in electrical contact with the face of the solder column.

15. The method of claim 1 wherein filling each of the first plurality of apertures with solder comprises filling each of the first plurality of apertures with solder so that some of the solder extends onto the second surface of the reconstituted wafer.

16. A method comprising,
    forming a reconstituted wafer by embedding a first semiconductor die in a first molding compound layer, with a face of the first semiconductor die lying substantially in a first plane with a face of the first molding compound layer of the reconstituted wafer;

positioning a first redistribution layer on a first surface of the reconstituted wafer, including forming a first plurality of electrically conductive traces with ones of the first plurality of electrically conductive traces in electrical contact with respective ones of a plurality of circuit contacts positioned on the face of the first semiconductor die;

drilling a first plurality of apertures into the reconstituted wafer, each extending from a second surface of the reconstituted wafer at least as far as a respective one of the first plurality of electrically conductive traces of the first redistribution layer;

filling each of the first plurality of apertures with solder so that some of the solder extends onto the second surface of the reconstituted wafer; and after filling each of the first plurality of apertures with solder, planarizing the second surface of the reconstituted wafer.

17. The method of claim 16 wherein planarizing the second surface of the reconstituted wafer includes planarizing solder that extends onto the second surface of the reconstituted wafer.

18. The process of claim 11 wherein forming the solder column in the blind aperture comprises forming the solder column so that the second end of the solder column extends beyond the surface of the reconstituted wafer.

19. A method comprising:
drilling a blind aperture into a reconstituted wafer, the aperture extending from a surface of the reconstituted wafer, through a molding compound layer, and into a first redistribution layer at least as far as a first electrical trace in the first redistribution layer;

forming a solder column in the blind aperture, with a first end of the solder column in electrical contact with the first electrical trace, and a second end exposed at the surface of the reconstituted wafer; and after forming the solder column, planarizing a surface of the solder column and the surface of the reconstituted wafer.

20. A method, comprising:
forming a reconstituted wafer by embedding a first semiconductor die in a first molding compound layer, with a face of the first semiconductor die lying substantially in a first plane with a face of the first molding compound layer of the reconstituted wafer;

positioning a first redistribution layer on a first surface of the reconstituted wafer, including forming a first plurality of electrically conductive traces with ones of the first plurality of electrically conductive traces in electrical contact with respective ones of a plurality of circuit contacts positioned on the face of the first semiconductor die;

forming a first plurality of apertures in the reconstituted wafer;

forming a vacuum around the reconstituted wafer;

placing solder over each of the first plurality of apertures; and releasing the vacuum while the solder is molten thereby filling the apertures with the solder.

21. The method of claim 20 wherein each aperture extends from a second surface of the reconstituted wafer at least as far as a respective one of the first plurality of electrically conductive traces of the first redistribution layer.

22. The method of claim 21 wherein filling the apertures places the solder in electrical contact with the respective one of the first plurality of electrically conductive traces.

23. The method of claim 20, further comprising after the solder fills the apertures, planarizing the second surface of the reconstituted wafer.

24. The method of claim 23 wherein planarizing the second surface of the reconstituted wafer comprises removing solder located on the second surface of the reconstituted wafer.

25. The method of claim 19, further comprising drawing a vacuum around the reconstituted wafer, and releasing the vacuum while the solder is molten.

\* \* \* \* \*